US006376138B1

(12) United States Patent
Horsten et al.

(10) Patent No.: US 6,376,138 B1
(45) Date of Patent: Apr. 23, 2002

(54) RENDERING OF CONTINUOUS TONE IMAGES BY REDUCING CLUSTERING OF HALFTONE DOTS

(75) Inventors: Bart Horsten, Rumst; Paul Delabastita, Antwerp; Jacobus Bosschaerts; Luc Schellekens, both of Mortsel, all of (BE)

(73) Assignee: AGFA-Gevaert, Mortsel (BE)

( * ) Notice: Subject to any disclaimer, the term of this patent is extended or adjusted under 35 U.S.C. 154(b) by 0 days.

(21) Appl. No.: 09/169,587

(22) Filed: Oct. 9, 1998

Related U.S. Application Data
(60) Provisional application No. 60/171,643, filed on Jan. 16, 1998.

(30) Foreign Application Priority Data

Oct. 9, 1997 (EP) .............................................. 97203139

(51) Int. Cl.[7] .............................. G03C 5/08; G03F 7/20
(52) U.S. Cl. ......................... 430/30; 430/204; 430/305; 430/617; 430/619; 358/298
(58) Field of Search ................................ 430/148, 617, 430/305, 619, 30, 204, 350; 358/474, 480, 494, 298

(56) References Cited

U.S. PATENT DOCUMENTS 5,700,610 A * 12/1997 Bosschaerts ................. 430/30

FOREIGN PATENT DOCUMENTS

| EP | 0734147 | 3/1995 |
| EP | 0687102 | 5/1995 |
| JP | 60012542 | 1/1985 |
| JP | 61145547 | 7/1986 |
| JP | 62115149 | 5/1987 |

* cited by examiner

*Primary Examiner*—Thorl Chea
(74) *Attorney, Agent, or Firm*—John A. Merecki; Hoffman, Warnick & D'Alessandro LLC

(57) ABSTRACT

Growth and clustering of halftone dots is a drawback in the reproduction of halftoned continuous tone images on prior art recording materials. Certain thermographic materials show a local microdot shrink effect called negative cross-talk upon neighboring microdots when exposing a microdot. Exposing these materials according to the frequency modulated halftone data of an image results in better tone rendering and lower noise due to lower dot clustering or negative cross-talk characteristics.

2 Claims, 4 Drawing Sheets

RENDERING OF CONTINUOUS TONE IMAGES BY REDUCING CLUSTERING OF HALFTONE DOTS

This application claims benefit of Provisional Application Ser. No. 60/171,643 filed Jan. 16, 1998.

DESCRIPTION

The present invention relates to an improved rendering technique for halftone images and corresponding improved materials, used for generating a screened reproduction of a continuous tone image by means of an electronic screening modulation of the original. An example of the technique is given for a thermal recording material.

BACKGROUND OF THE INVENTION

Thermal imaging or thermography is a recording process wherein images are generated by the use of imagewise modulated thermal energy.

Direct thermal thermography is concerned with materials which are substantially not photosensitive, but are sensitive to heat or thermosensitive. Imagewise applied heat is sufficient to bring about a visible change in a thermosensitive imaging material.

Most of the "direct" thermographic recording materials are of the chemical type. On heating to a certain conversion temperature, an irreversible chemical reaction takes place and an image is produced by a change of the local optical density.

U.S. Pat. No. 5,424,182 discloses a thermal imaging material and preparation.

Many reproduction methods are only capable of reproducing a small number of stable image tones. For example, offset printing is only capable of printing two stable tone values i.e. deposit ink or not. In order to reproduce images having continuous tones, a halftoning or screening technique is used. In the graphic arts environment, halftoning techniques convert density values of tints and images into a geometric distribution of binary dots that can be printed. The eye is not able to see the individual halftone dots, and only sees the corresponding "spatially integrated" density value. In a more general context, halftoning techniques can be seen as methods to convert "low spatial, high tonal resolution information" into an equivalent of "high spatial, low tonal resolution information". The qualifiers "low" and "high" have to be seen on a relative scale in this context. In amplitude-modulation screening the halftone dots, that together give the impression of a particular tone, are arranged on a fixed geometric grid. By varying the size of the halftone dots, the different tones of images can be simulated. Consequently, this technique can also be called "dot-size modulation screening". This class of halftoning technique is traditionally used in combination with a digital film recorder. A typical digital film recorder employs a scanning laser beam that exposes a photosensitive material at high resolution. The "grid" that defines the resolution at which the laser beam can be switched on or off, usually has an element size in the range of 1/1800 of an inch. The photosensitive material can be a photographic film from which a printing plate is later prepared by means of photomechanical techniques. The smallest addressable unit on a recorder is often called a "micro dot", "recorder element", or "rel". Its size is referred to as the recorder "pitch". As illustrated in FIG. 3a, a dot-size modulated halftone dot is made up of a clustered set of recorder elements.

The most important characteristics of a screening or halftoning technique for faithfully reproducing continuous tone information include:

1) The image rendering characteristics, more specifically the capability of the technique to render spatial detail in the original image content without the introduction of artifacts such as moiré, textures and noise, as well as the capability to render a full range of tones;
2) The photomechanical characteristics of the halftone dots produced by the method, which determine how consistently halftone dots can be recorded, copied or duplicated in the different steps of the photomechanical preparation of the printing plates; and,
3) The behaviour of the halftones on an offset printing press.

The class of amplitude-modulation halftoning, with some of its variants, will now be reviewed in the light of the above characteristics, and their advantages and disadvantages will be discussed.

Amplitude-modulation screening has as its major advantages that it has excellent photomechanical reproduction characteristics, and that, for screens with rulings up to 200 lines/inch, it prints predictably on offset presses. An important disadvantage of amplitude-modulation screening, however, is the fact that unwanted patterns can occur within the halftoned image. Depending on their origin, these patterns are called subject moiré, colour moiré or internal moiré. Subject moiré results from the geometric interaction between periodic components in the original subject matter and the halftone screen itself. Methods addressing subject moiré are disclosed in e.g. U.S. Pat. No. 5,130,821, EP-A-0 369 302 and EP-A-0 488 324. These methods do not, however, completely solve the problem.

Colour moiré results from interferences between the a halftones of the different colour separations of the image. The use of screen angles for the different colour separations shifted by 60 degrees one with respect to the other has been suggested to address this problem. Several disclosures relate to the problem of generating screens with these angles or close approximations thereof. See e.g. U.S. Pat. Nos. 4,419, 690, 4,350,996, 4,924,301 and 5,155,599. Other combinations of angles, frequencies or relative phases of the halftone dot patterns for the different colour separations have also been used to overcome the same problem, as described e.g. in U.S. Pat. Nos. 4,443,060, 4,537,470 and EP-A-0-501 126.

Internal moiré refers to patterns resulting from the geometric interaction of the halftone screen with the addressable grid on which they are rendered. Methods to reduce internal moiré are usually based on the introduction of a random element that breaks up or "diffuses" the phase error that periodically builds up as a consequence of the frequency and angle relation between the halftone screen and the addressable grid on which it is rendered. Examples of such techniques are disclosed in U.S. Pat. Nos. 4,499,489, 4,700, 235, 4,918,622, 5,150,428 and WO-A-9 004 898.

EP-A-0 734 147, EP-A-0 774 857 and EP-A-0 734 148 provide methods for generating screened reproductions of continuous tone images with improved reproduction characteristics.

These three patent applications disclose methods for improving the image quality by complicating the modulation of the laser. These solutions not only tend to complicate the manufacturing process, they are also time-consuming and costly.

Another screening technique is referred to as frequency modulation halftoning. Whereas in amplitude modulation screening the halftone dots, that together give the impression of a particular tone, are arranged on a fixed geometric grid and are their size is varied to simulate the different tones of images, in frequency modulation screening the distance between the halftone dots is modulated rather than their size.

The arrangement of exposed microdots according to frequency modulation screening is shown in FIG. 3b. According to FIG. 3b frequency-modulation halftone dots consist of individual recording elements. Each black square in FIG. 3b represents one frequency-modulation halftone dot, occupying exactly one "rel". The whole FIG. 3b shows a region or set of dispersed black frequency-modulation halftone dots, covering each one individual recording element. In the prior art methods, the size of a frequency-modulated halftone dot equals the size of a recorder element.

Various frequency-modulation screening techniques have been disclosed and they can be divided into the following subclasses:

(1) Point-to-point thresholding based techniques;
(2) Error Diffusion techniques (and their variations); and,
(3) Special techniques, such as that disclosed in DE-A-2 931 098, and further developed in U.S. Pat. No. 4,485,397.

The most representative example of point-to-point thresholding is the halftoning based on the "Bayer" dither matrix. See BAYER, B. E. "An Optimum Method for Two-level Rendition of Continuous-tone Pictures", New-York: Proc. IEEE International Conference on Communications, Conference Record, 1973, pp. (26–11), (26–15). The Bayer dither matrix has a size that is a power of two, and contains threshold values that are arranged in such a fashion that, when thresholded against increasing levels of density, every halftone dot is "as far away as possible" from the halftone dots that are used to render the lower density levels.

Another point-to-point thresholding technique uses a "blue-noise mask" instead of a Bayer dither matrix. It is described in U.S. Pat. No. 5,111,310. The blue-noise mask is the result of an optimization (filtering) performed iteratively (for the subsequent threshold "layers") between the halftone dot patterns produced by the mask and their Fourier transforms.

The halftone dot patterns produced by the Bayer dither matrix contain strong periodic components, visible as "texture" that can potentially create moiré problems similar to the dot-size modulation algorithms. Because the energy of the periodic dither components is "spread" over the different harmonics, and because most of these harmonics have a relatively high frequency compared to the fundamental frequency of dot-size modulation, the moiré that occurs is less disturbing.

The "Blue-noise mask" threshold matrix produces distributions of halftone dots that are a periodic. This method is therefore free of the moiré problems that occur with the dot-size modulation methods or with the Bayer dither matrix. The aperiodic character of the halftone dot distributions of the blue-noise mask technique translates in the frequency domain into a "continuous" power spectrum. This suggests that at least some energy is also present in the very low frequency bands of the spectrum. This energy at low (visible) spatial frequencies is one of the reasons why tints rendered with the blue-noise mask technique can appear grainy. The relation between "graininess" introduced by frequency-modulation halftoning methods and the shape of the frequency spectrum is extensively discussed by Ulichney, R. "Digital Halftoning", Cambridge Mass.: MIT Press, 1987.

Perhaps the best known of all "frequency-modulation" techniques is the error diffusion algorithm. It comes in many variations, but the principle is always the same: the error that occurs as a result of the binarization (or, in a more general context, the quantization) of the image data during the rendering is "diffused" to one or more of the unprocessed pixels. Best known is the Floyd and Steinberg algorithm (Floyd, R. W. and Steinberg, L. An Adaptive Algorithm for Spatial Greyscale, Proc. SID,1976. vol. 17/2, pp. 75–77). However many variations exist that usually differ in the order in which pixel halftoning is done, in how the error is diffused (to how many pixels and with which weights), or in how a random element is introduced in the algorithm to break up the unwanted patterning that can occur with some of them.

All of the frequency-modulation halftoning techniques that produce aperiodic halftone dot distributions share the advantage that they are much less sensitive to the problems of moiré as compared to the "dot-size modulation" techniques.

A problem associated to frequency modulated halftone images is their noisy or grainy appearance to the observer. This problem is less conspicuous for amplitude modulated halftone images, since according to that technique the halftone dots are laid out on a periodic grid, which is not disturbing for the human observer as long as the screening frequency is at least 100 lpi (lpi=lines per inch, 1 inch is 25.4 mm). Since the halftone dots according to frequency modulated halftoning are located more or less randomly, an image reproduced by this technique has a broad spatial frequency spectrum. A spacial frequency spectrum may be obtained by applying a two-dimensional discrete Fourier transform to the screened image data. Although it seems that frequency modulated halftone dots, due to their small size and small relative distance, would introduce only high frequencies in the spatial frequency spectrum, a discrete two-dimensional Fourier transform of such a halftone image shows that also low frequencies are present and have a considerable energy level in the spectrum. The high frequencies in the spectrum are filtered by the human eye and are not disturbing for the human observer. The noisy appearance to the human observer of frequency modulated halftone dots can be attributed to the presence of these low frequency components. This results in a degradation of the image quality in printing systems, even for printing systems having a relatively high spatial resolution for producing frequency modulated halftone dots.

In order to improve the image quality of thermal systems the manufacturers of the thermal printers have focused on fine tuning the heating controls of the thermal printhead.

WO-A-95 012 493 discloses a micro-addressing technique in direct thermal hyperacuity printers allowing high-resolution dot outline positioning. A driver circuit provides a plurality of drive energies having a plurality of thermal distributions associated herewith, producing non-periodic halftone dot distributions. These thermal distributions interact with print media to form binary images having active and inactive areas. A frequency modulated halftone image printed by such a printer still suffers from high noise levels, if no special measures are taken.

WO-A-95 033 330 discloses a method for local resolution enhancement by modulating the stream based on the previous, current and next grey scale values. Also this method does not address the image quality, perverted by the noise problem.

OBJECTS OF THE INVENTION

It is an object of the present invention to improve the image quality in printing systems.

It is a specific object of the invention to achieve better tone rendering.

It is another specific object of the invention to achieve less noise in screening applications, especially for low resolution printing systems.

SUMMARY OF THE INVENTION

The above-described deficiencies are addressed by a method according to the present invention for rendering a reproduction of a continuous tone image on a recording material. In this method, the continuous tone image are screened by a frequency-modulating halftone technique to obtain frequency modulated halftone data. The recording material is then scanned according the frequency modulated halftone data. The recording material shows a negative cross-talk effect upon adjacent exposed microdots.

A halftone image is an image in which the continuous tones or grey-levels of an original image are reproduced by varying the size of the halftone dots, the number of halftone dots per unit area and/or the density of the halftone dots in the pattern that forms the image. The density variation of halftone dots in a halftone image is coarser than the density or intensity variation of the corresponding original continuous tone image. In a binary printing system, the halftone dots can take two density levels: a lower density level and a higher. In multilevel printing systems, the halftone dots, or even each individual microdot of a halftone dot, may take one of more than two different density levels. The concept of multilevel frequency modulated halftoning is further explained in EP-A-0 682 438.

The terms frequency-modulation halftoning or FM-screening shall mean any halftoning technique in which: the average distance between the halftone dots changes as a function of the tone value; or the number of the resulting halftone dots per unit area varies with the tone value. A halftone dot is an area having a substantially constant first optical density, surrounded by an area having a substantially constant second optical density, different from the first optical density. A halftone dot may be formed by one black microdot on a white background. A halftone dot may also be formed by two or more adjacent black microdots on a background of white microdots, i.e. surrounded by white microdots; this is typical for regions having an integrated optical density, that is lower than a specific value. Alternatively, a halftone dot may comprise one or more white microdots, surrounded by black microdots; this is typical for regions having an integrated optical density, higher than a specific value. Halftone dots may also be defined on a substrate having ink accepting and ink repellant zones. A halftone dot may then be defined by an ink repellant zone surrounded by an ink accepting zone or vice versa.

The term negative crosstalk can be defined as a local microdot shrink effect, that appears in halftoning, when neighbouring microdots are exposed to energy for changing the optical density of the microdots. When the total surface area of two exposed adjacent microdots is smaller than the total surface area of two individual exposed microdots, the effect can be defined as negative crosstalk. Two microdots are adjacent, if the distance between their respective centres is smaller than the largest size of an isolated exposed microdot. If the shape of the microdot is circular, the size is its diameter; if the shape is square or rectangular, the size is the length of one diagonal; if the shape is elliptical, the size is the length of the longer axis of the ellipse, etc.

Also when two adjacent microdots are exposed and when the resulting optical density close to their touching border is considerably different from the optical density of the middle of the individual exposed microdots, this is referred to as negative cross-talk. For black exposed microdots, the touching border is white, for white exposed microdots, the touching border is black.

Further advantages and embodiments of the present invention will become apparent from the following description and drawings.

DETAILED DESCRIPTION OF THE INVENTION

Figure 1A:
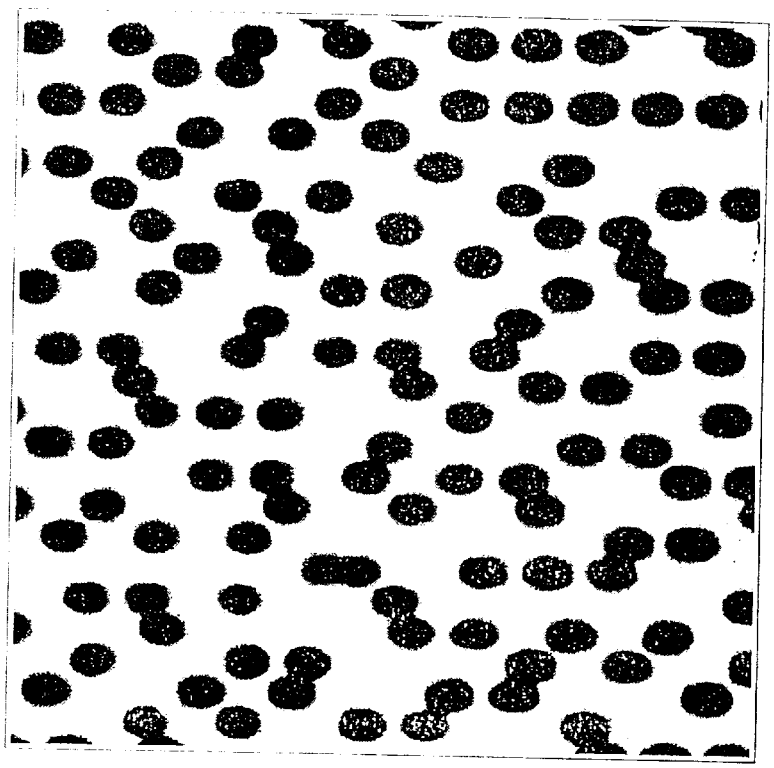
FIG. 1a is an enlargement of a 1 mm×1 mm film area showing a 30% FM-screen on prior art film.

Halftone images may be recorded on graphic film by image-wise exposure of a photosensitive film by an imagesetter and developing the latent image on the exposed film in a processing liquid. Alternatively, dry films and dry-film imagesetters or thermal printers have been successful since the middle of 1995. Laser printers for exposing heat-sensitive material are both compact and easy to operate. The film is imaged using a direct thermal imaging technology. The image gives the impression of a resolution of 2400× 2400 dpi (dpi=dots per inch, 1 inch is 25.4 mm) and is useful for colour work. On a photosensitive film, a resolution of 3600 dpi for the individual microdots may be achieved.

Patent application EP-A-0 782 043 discloses a thermographic recording material with improved tone reproduction.

The material which may be used according to the present invention is illustrated by the following example. The preferred thermographic recording material comprises a support, an imaging layer and a protective coating. The percentages and ratios given in table 1 for this example are by weight and expressed in $g/m^2$.

The ingredients of the imaging layer (see table 1) used in this example are:

as organic silver salt: silver behenate represented in the examples by AgBeh;

as binder: poly(vinyl butyral) (PIOLOFORM BL16 and PIOLOFORM BM18) represented in the examples by PVB1 and PVB2 (PIOLOFORM is a registered trademark from Wacker Germany);

as reducing agent: ethyl 3,4-dihydroxybenzoate and propyl gallate represented by R1 and R2;

as toning agent:

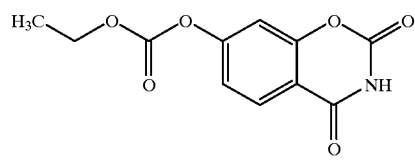

represented by TA1;

as levelling agent: silicone oil (Baysilone™ from Bayer AG) represented by oil;
as stabilizers:
tetrachlorophthalic anhydride represented by S1;
mercaptotetrazole represented by S2;

TABLE 1

| AgBeh | PVB1 | PVB2 | R1 | R2 | TA1 | Oil | S1 | S2 |
|---|---|---|---|---|---|---|---|---|
| 6,263 | 3,182 | 3,132 | 1.0126 | 0.256 | 0.794 | 0.024 | 0.150 | 0,136 |

The protective coating ingredients used in this example are:

| | |
|---|---|
| # poly(vinyl alcohol) (Mowiviol ™ WX 48 20, Wacker Chemie): | 2.10 g/m$^2$ |
| # dispersion agent (Ultravon ™ W from Ciba Geigy)*: | 0.075 g/m$^2$ |
| # colloidal silica (Levasil ™ VP AC 4055 from Bayer AG, a 15% aqueous dispersion of colloidal silica): | 1.05 g/m$^2$ |
| # mono[isotridecyl polyglycolether (3 EO)] phosphate (Servoxyl ™ VPDZ 3/100 from Servo Delden): | 0.075 g/m$^2$ |
| # mixture of monolauryl and dilauryl phosphates (Servoxyl VPAZ 100 from Servo Delden): | 0.075 g/m$^2$ |
| # talc (Steamic ™ OOS from Talc de Lusenac): | 0.045 g/m$^2$ |
| # porous silica (Syloid ™ 72 from Grace): | 0.09 g/m$^2$ |
| # glycerine monotallow acid ester (Rilanit ™ GMS from Henkel): | 0.15 g/m$^2$ |
| # tetramethyl orthosilicate (hydrolyzed in the presence of methanesulfonic acid): | 0.87 g/m$^2$ |
| | 4.53 g/m$^2$ |

* converted into acid form by passing through an ion exchange column.

A subbed polyethylene terephthalate support having a thickness of 100 μm was coated from a coating composition containing butanone as a solvent to obtain thereon, after drying for 1 hour at 50° C., layers with the compositions given in table 1 and 2.

Thermographic Printing

The printer was equipped with a thin film thermal head with a resolution of 300 dpi and was operated with a line time of 19 ms (the line time being the time needed for printing one line). During the line time the printhead received constant power.

The average printing power, being the total amount of electric power input during one line time divided by the line time and by the surface area of the heat-generating resistors was 1.5 mJ/dot being sufficient to obtain maximum optical density in each of the recording materials.

Image Evaluation

Figure 4:
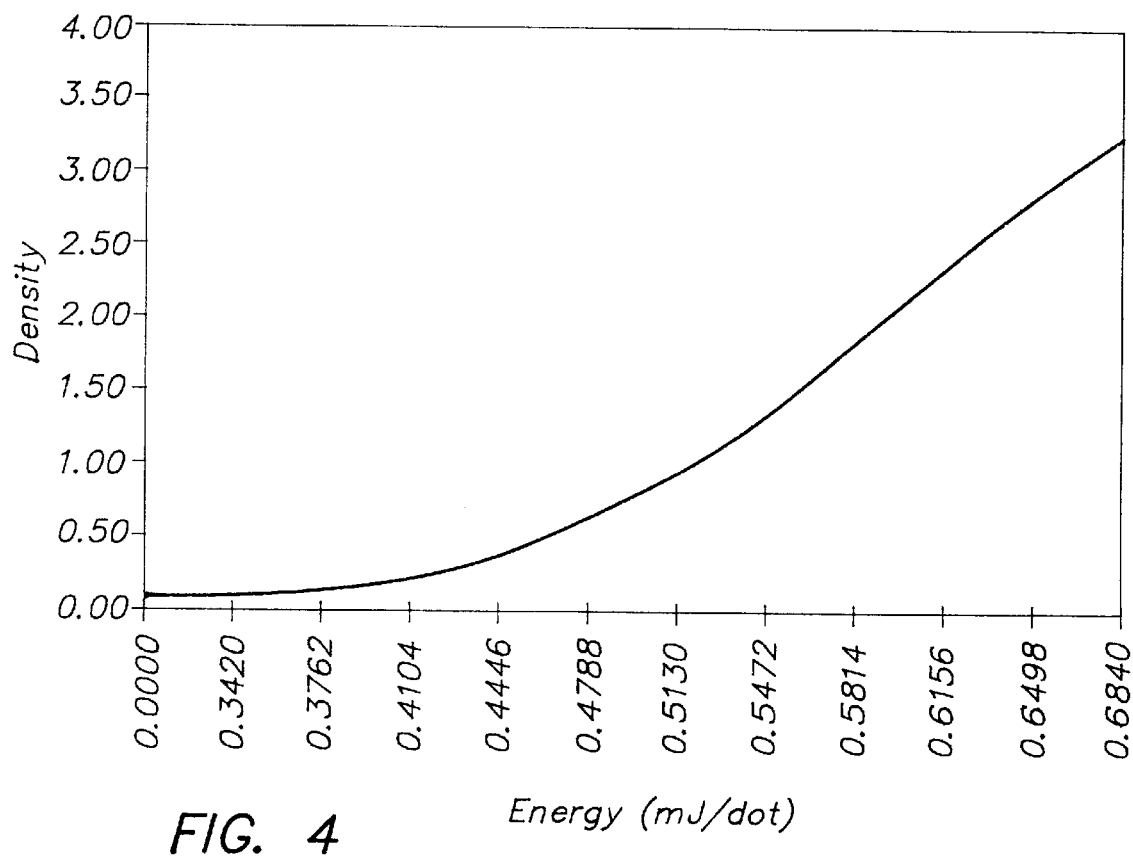
FIG. 4 shows a sensitometric table and a relation between the applied energy and the corresponding density.

The maximum and minimum optical densities of the prints given in FIG. 4 were measured through a visual filter with a Macbeth™ TD904 densitometer in the grey scale step corresponding to data levels of 255 and 0 respectively.

For evaluating the tone reproduction capabilities of the thermosensitive recording materials of the preferred example, the numerical gradation value (NGV) corresponding to the expression: $(2.5-0.06)/(E_{2.5}-E_{0.06})$ was determined; where $E_{2.5}$ is that energy in milli-Joule applied to a dot area of 87 μm×87 μm of the recording material required to obtain an optical density value of 2.5 as measured with a Macbeth™ TD904 densitometer, and $E_{0.06}$ is that energy in milli-Joule applied to a dot area of 87 μm×87 μm of the recording material required to obtain an optical density value of 0.06 as measured with a Macbeth™ TD904 densitometer. The applied energy in mJ (milli-Joule) is actually the electric power input measured for each of the resistors of the thermal head.

A thermal printer "PRESSMATE" manufactured by Lasermaster Inc. includes a software option referred to as FM-screening. "PRESSMATE" is a registered trademark of Lasermaster Inc. In frequency-modulation screening the distance between the halftone dots is modulated rather than their size.

Figure 2A:
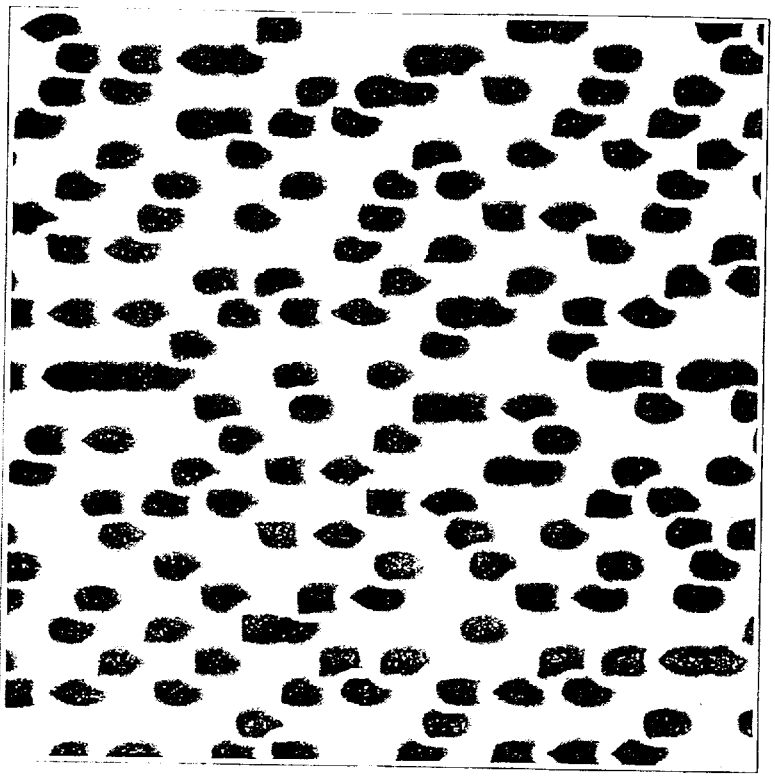
FIG. 2a is an enlargement of a 1 mm×1 mm film area showing a 30% FM-screen having the negative cross-talk effect.
Figure 2B:
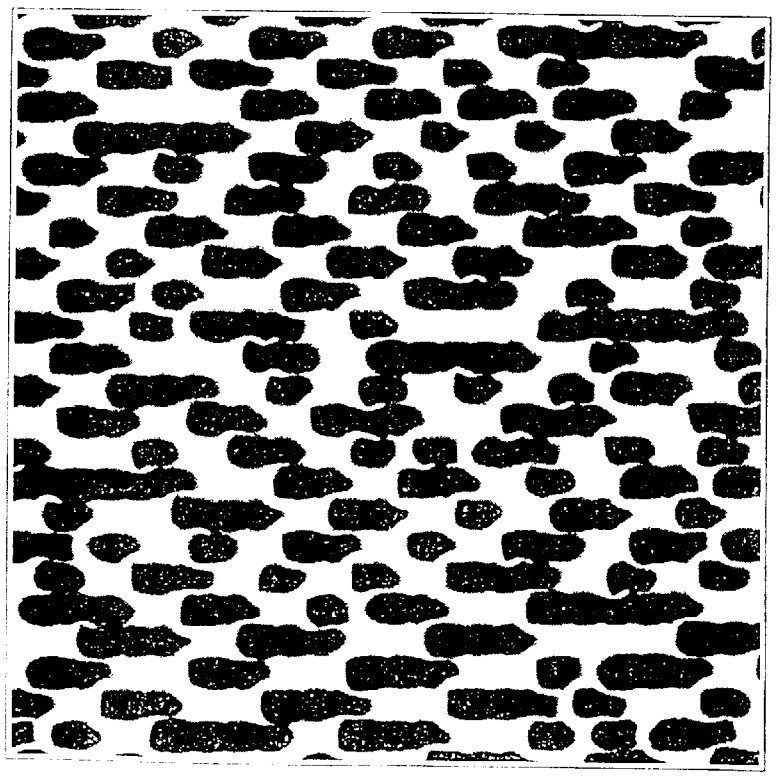
FIG. 2b is an enlargement of a 1 mm×1 mm film area showing a 60% FM-screen having the negative cross-talk effect.
Figure 3A:
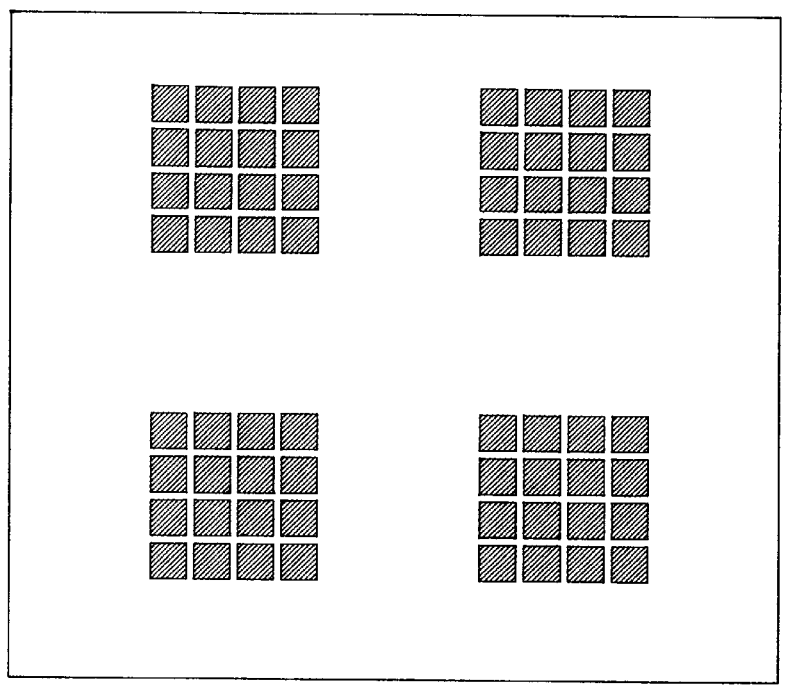
FIG. 3a illustrates four "dot-size modulated halftone dots" which are made up of a clustered set of 16 recording elements or microdots.
Figure 3B:
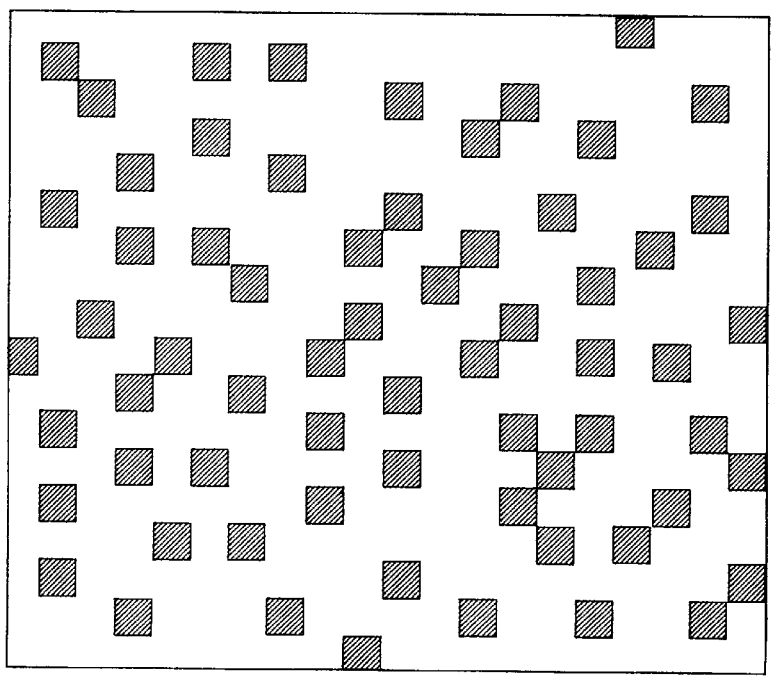
FIG. 3b illustrates "frequency-modulated screening" wherein the individual recording elements are placed at random. The size of the frequency-modulated halftone dot equals the size of a recorder element.

The results of exposure by a "PRESSMATE" system, using FM-screening, of a thermal film, according to this invention are illustrated in FIG. 2a and 2b.

FIG. 2a is an enlargement of a 1 mm×1 mm film area showing a 30% FM-screen. This means that the area of FIG. 2a, viewed at a normal scale, by which the different optical densities are visually integrated, represents for an observer a homogenous optical density of 30% of the maximum density achievable by the material.

Figure 1B:
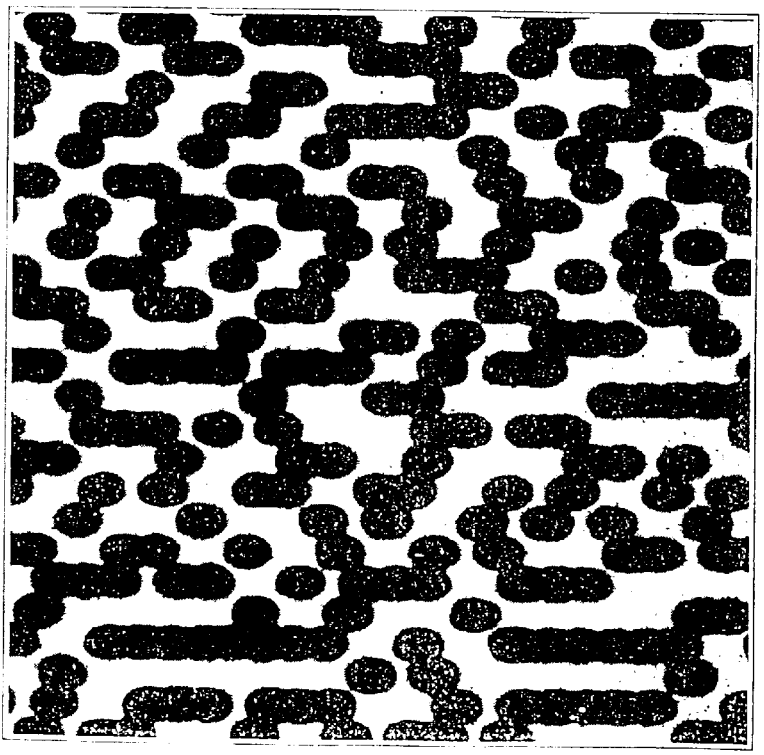
FIG. 1b is an enlargement of a 1 mm×1 mm film area showing a 60% FM-screen on prior art film.

FIG. 1a and FIG. 1b are comparable to FIG. 2a and FIG. 2b, but the halftone images are imaged on prior art film.

The dot shape of isolated exposed microdots on FIG. 2a is comparable to the dot shape of such dots on FIG. 1a. However, the dot shape of exposed or imaged (black) microdots in the neighbourhood of other exposed microdots in FIG. 2a is substantially different compared to the dot shape on the prior art thermal film shown in FIG. 1a. According to FIG. 1a, when two or more exposed microdots meet on the prior art film, they cluster together and at the same time are responsible for a certain dot growth. This dot-gain effect (bleeding) becomes more and more important with increasing dot percentages. The result is that adjacent exposed microdots cluster together to one larger halftone dot, the larger halftone dot having an area that is substantially equal to the total area of the clustered individual exposed microdots. In FIG. 1a isolated exposed (black) microdots are still visible, some exposed microdots have clustered to form a halftone dot composed of two exposed microdots and some halftone dots are formed from three adjacent exposed microdots. These clusters of two and three microdots are responsible for lower frequencies in the spatial frequency spectrum of the halftone image, and give to the human observer a noisy or grainy effect, although the individual microdots or small clusters are not discernable by the naked eye. As set out before, graininess of frequency-modulated halftone images is a known problem. It is known in the art that the noise problem may be introduced by the relative position of the exposed microdots, which is referred to as algorithmic noise. Algorithmic noise in a halftoning process is hardly to correct by the exposure system. The better frequency modulation techniques deal with the problem of algorithmic noise, by which this problem may thus be solved. Such techniques determine the placement of halftone dots such that low frequencies are not introduced.

As shown in FIG. 1a, a noise problem may also be introduced by microdot convolution, independently from the performance of the halftoning algorithm. Convolution occurs when neighbouring microdots touch each other or overlap, i.e. start to form clusters. Noise due to convolution may be avoided by writing smaller microdots. But this has the disadvantage that even a 100% dot percentage does not completely fill the area with the highest optical density. Better laser spots having a sharper decay may also reduce the convolution problem, but such laser spots considerably increase the system cost and may require longer exposure times in order to better control the exposure locally. Such better controlled laser spots may also require graphical film having a steeper gradation. A film with a steep gradation is a photosensitive material that has a narrow exposure threshold interval. When the film is exposed by an exposure level below that threshold interval, the film reacts as if it has not been exposed. If the film is exposed by an exposure level higher than the threshold interval, then the film reacts as if it has been exposed by the maximum exposure level appropriate for that film. For thermal contact systems, not operating with optical laser spots, a shaping of the spatial exposure distribution is even more difficult and would be extremely expensive. Negative cross-talk, which is a feature incorporated in the material given in the example herein before, reduces or even solves the problem of noise caused by convolution, without imposing extra requirements on the exposure system or without requiring a specific microdot shape such as square or rectangular. Algorithmic noise, as discussed above, will usually not be decreased by the feature of negative cross-talk, but negative cross-talk will avoid increase of the noise level induced by algorithmic noise. According to negative cross-talk, adjacent exposed microdots do not merge to form a clustered halftone dot larger than a single isolated exposed microdot, but rather the adjacent exposed microdots are separated from each other by a gap having a low optical density. This may be achieved by deformed exposed microdots adjacent to other exposed microdots, the deformed exposed microdots having an area with a high optical density, that area being smaller than the area of an isolated exposed microdot. It may be seen on FIG. 2a and FIG. 2b that exposed adjacent microdots along processing direction, i.e. horizontally from right to left on both figures, do form elongated clusters. This may be attributed to the fact that the thermal element is not switched of between two consecutive and thus adjacent microdots. Each microdot however, subsequently exposed after an adjacent firstly exposed microdot, and not located on the processing direction, gets a small deformation to leave a gap between the firstly and subsequently exposed microdot. This may be attributed to the fact that a first thermal element is switched on first, and an adjacent thermal element is switched on after the first thermal element. Also in high density regions, such as shown in FIG. 2b, the number of halftone dots, i.e. areas having a high optical density, isolated from other such areas by a gap of low optical density, that number of halftone dots is substantially higher than the number of halftone dots that would be present if adjacent microdots would cluster together, as shown in FIG. 1b. This is because in FIG. 2b a gap is formed between adjacent exposed microdots.

A system, where the clustering is not avoided or inhibited at higher integrated optical densities by negative cross-talk and operated under the mode of frequency-modulated halftone screening renders images having a considerable lower visual quality due to convolution noise.

Another effect of the bleeding or clustering of the exposed microdots according to FIG. 1a is that the integrated optical density considerably increases when adjacent microdots cluster. This has an effect that is described now in more detail. Suppose that if 29% of the microdots of a certain area is exposed, in order to get an optical density of D=0.149 ($D=-\log_{10}(I/I_0)=-\log_{10}(1.0-0.29)=0.149$, the transmission of the unexposed film is taken as $I_0$), all exposed microdots are isolated, i.e. no clustering occurs. The optical density of such an area may be measured by an integrating densitometer, which could be e.g. D=0.149. Suppose that by exposing 30% of the microdots, at lease one extra microdot must be exposed, this microdot touching at least one other exposed microdot, already present in the 29% of the microdots. This extra microdot will cluster or bleed in the existing exposed microdots and the integrated optical density may get a considerable jump, e.g. to D=0.160 instead of the theoretical value of $D=0.155=-\log_{10}(1-0.3)$. It is thus in such a situation very difficult to reach an optical density of 0.155. On the other hand, the integrated optical density is also very sensitive to small dot percentage variations (from 29% to 30%), which poses serious problems for the tonal stability of the final result.

According to FIG. 2a, most of the neighbouring exposed microdots are still separated from each other, even though their centre points are very close to each other. The exposure of the microdots in FIG. 2a occurred from right to left on the figure. It is clear that an isolated microdot is not influenced by neighbouring microdots. However, if a first microdot is exposed, an at a later time a second neighbouring microdot is exposed, the size and the shape of the second microdot is substantially influenced by the first microdot. The result is that the first and second microdot do not merge or cluster and that a small low density gap remains between the two exposed microdots. Thus, the number of small halftone dots is larger in FIG. 2a than in FIG. 1a, although the number of exposed microdots is higher in FIG. 2a. Therefore, the appearance of FIG. 2a at normal scale to a human observer is less grainy than the appearance of FIG. 1a. Moreover, addition of one extra exposed microdot on a material according to FIG. 2a is less prone to a tone jump than on a material according to FIG. 1a, since dot growth is impeded by neighbouring microdots. By better control of the dot growth, the system reacts in a more linear manner. This means that the integrated optical density as a function of the dot percentage, i.e. percentage of exposed microdots in a fixed area, approaches more a linear behaviour. The halftone image corresponding to FIG. 2a has accordingly a better quality than the image corresponding to FIG. 1a, and the tone control for a film according to FIG. 2a is more reliable than the tone control for a system according to FIG. 1a.

FIG. 2b is an enlargement of a 1 mm×1 mm film area showing a 60% FM-screen. At normal scale, that area represents an optical density of $D=0.398 (=-\log_{10}(1-0.6))$ of the maximum density. The clustering effect starts at a certain dot size, introducing artifacts that can be defined as frequency-noise or convolution-noise. According to FIG. 1b, the shadow areas (70–90%) become darker than they should be, resulting in a severe loss of details. This dot-gain effect has to be compensated by means of a gradation compensation curve. By avoiding clustering of adjacent exposed microdots, the tone curve of the rendering system is more linear. Another perverse side effect of dot gain in frequency modulation is that it can result in the introduction of additional graininess.

According to FIG. 2b, two or more dots on the hew thermal film on the contrary, influence each other, resulting in a certain local dot shrink or negative crosstalk. As shown in FIG. 2b, when two dots meet on the new film, a second microdot that is exposed after a first microdot, will be smaller than the first. This results in brighter and more detailed shadows. Another advantage is a total absence of artifacts that may be attributed to clustering. The local dot shrink or negative crosstalk can be advantageous for the smooth conversion of continuous tone images into halftones.

In systems without this type of negative cross-talk, dot gain corrections are required, thereby complicating the modulation of the exposure systems and making them slower and/or more expensive. Other imaging systems like laser recording systems on photosensitive film in combination with halftoning, deal with the same dot-gain and convolution noise problems. These problems can also there be solved by introducing a photosensitive material having a negative cross-talk characteristic.

What is claimed is:

1. A method for rendering a reproduction of a continuous tone image on a thermographic recording material showing negative crosstalk characteristics upon adjacent exposed microdots, comprising the steps of:

screening said continuous tone image by a frequency-modulating halftone technique to obtain frequency modulated halftone data; and exposing said thermographic recording material with an imaging system according to said frequency modulated halftone data.

2. The method according to claim 1, wherein adjacent exposed microdots are separated by a gap, said gap having an optical density substantially different from the optical density of the centres of the exposed microdots.

* * * * *